(12) United States Patent
Roh et al.

(10) Patent No.: US 12,156,470 B2
(45) Date of Patent: Nov. 26, 2024

(54) THERMOELECTRIC ELEMENT

(71) Applicant: LG INNOTEK CO., LTD., Seoul (KR)

(72) Inventors: Myoung Lae Roh, Seoul (KR); Jin Gyeong Park, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 131 days.

(21) Appl. No.: 17/620,442

(22) PCT Filed: Jun. 17, 2020

(86) PCT No.: PCT/KR2020/007827
§ 371 (c)(1),
(2) Date: Dec. 17, 2021

(87) PCT Pub. No.: WO2020/256398
PCT Pub. Date: Dec. 24, 2020

(65) Prior Publication Data
US 2022/0359804 A1    Nov. 10, 2022

(30) Foreign Application Priority Data

Jun. 18, 2019 (KR) .................. 10-2019-0072192

(51) Int. Cl.
*H10N 10/17* (2023.01)
*H10N 10/82* (2023.01)
(52) U.S. Cl.
CPC ............ *H10N 10/17* (2023.02); *H10N 10/82* (2023.02)

(58) Field of Classification Search
CPC ............................. H10N 10/82; H10N 10/17
See application file for complete search history.

(56) References Cited

U.S. PATENT DOCUMENTS

| 2009/0236087 A1* | 9/2009 | Horio | H10N 10/13 165/185 |
| 2015/0214461 A1* | 7/2015 | Kurihara | H10N 10/01 257/467 |
| 2015/0333246 A1* | 11/2015 | Lee | H10N 10/17 136/205 |

(Continued)

FOREIGN PATENT DOCUMENTS

| CN | 203461187 U | 3/2014 |
| CN | 105810809 * | 7/2016 |

(Continued)

*Primary Examiner* — Uyen M Tran
(74) *Attorney, Agent, or Firm* — Birch, Stewart, Kolasch & Birch, LLP

(57) ABSTRACT

A thermoelectric element according to one embodiment of the present disclosure includes a first substrate, a first insulating layer disposed on the first substrate, a second insulating layer disposed on the first insulating layer, a first electrode disposed on the second insulating layer, and a semiconductor structure disposed on the first electrode, wherein the first insulating layer includes an uneven portion, a partial region of the first electrode is buried in the second insulating layer, the second insulating layer includes a concave portion which is concave in a direction toward the first insulating layer from a side surface of the first electrode, and the concave portion vertically overlaps the uneven portion.

11 Claims, 8 Drawing Sheets

(56) References Cited

U.S. PATENT DOCUMENTS

| | | |
|---|---|---|
| 2016/0181500 A1 | 6/2016 | Lin et al. |
| 2016/0245556 A1 | 8/2016 | Laemmle et al. |
| 2018/0261751 A1 | 9/2018 | Angermann |

FOREIGN PATENT DOCUMENTS

| | | | | | |
|---|---|---|---|---|---|
| CN | 105810809 A | * | 7/2016 | ............ | H01L 35/30 |
| JP | 5-335629 A | | 12/1993 | | |
| JP | 6-169108 A | | 6/1994 | | |
| JP | 8-330638 A | | 12/1996 | | |
| JP | 11-168245 A | | 6/1999 | | |
| JP | 2003-298126 A | | 10/2003 | | |
| JP | 2004-274072 A | | 9/2004 | | |
| JP | 2006-269572 A | | 10/2006 | | |
| JP | 2006269995 | * | 10/2006 | | |
| JP | 2006269995 A | * | 10/2006 | ............ | H01L 35/32 |
| JP | 2010-118475 A | | 5/2010 | | |
| JP | 2016092027 | * | 5/2016 | | |
| JP | 2016092027 A | * | 5/2016 | | |
| KR | 10-2013-0035016 A | | 4/2013 | | |
| KR | 20160126803 | * | 11/2016 | | |
| KR | 20160126803 A | * | 11/2016 | | |
| WO | 2005/124882 A1 | | 12/2005 | | |

* cited by examiner

[FIG. 1]
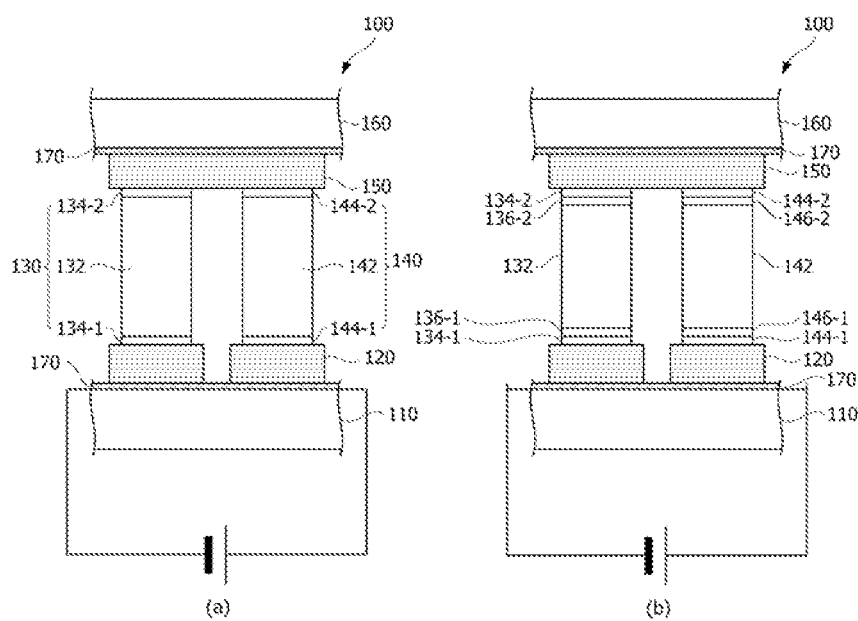
[FIG. 2]
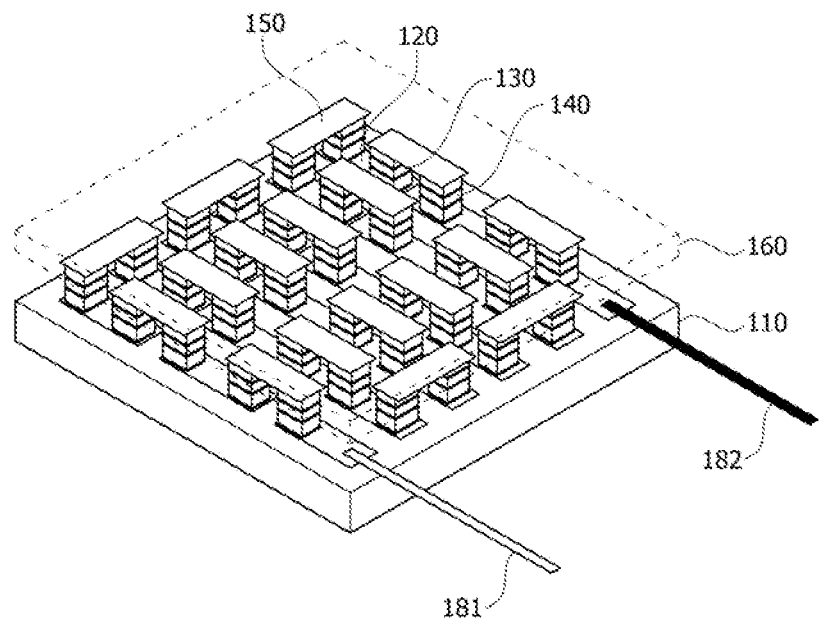

[FIG. 3]
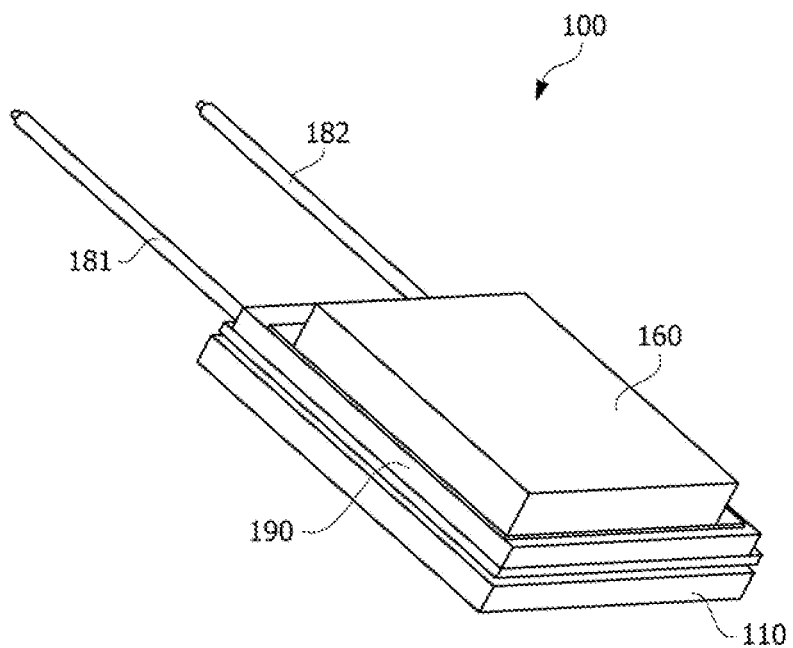

[FIG. 4]
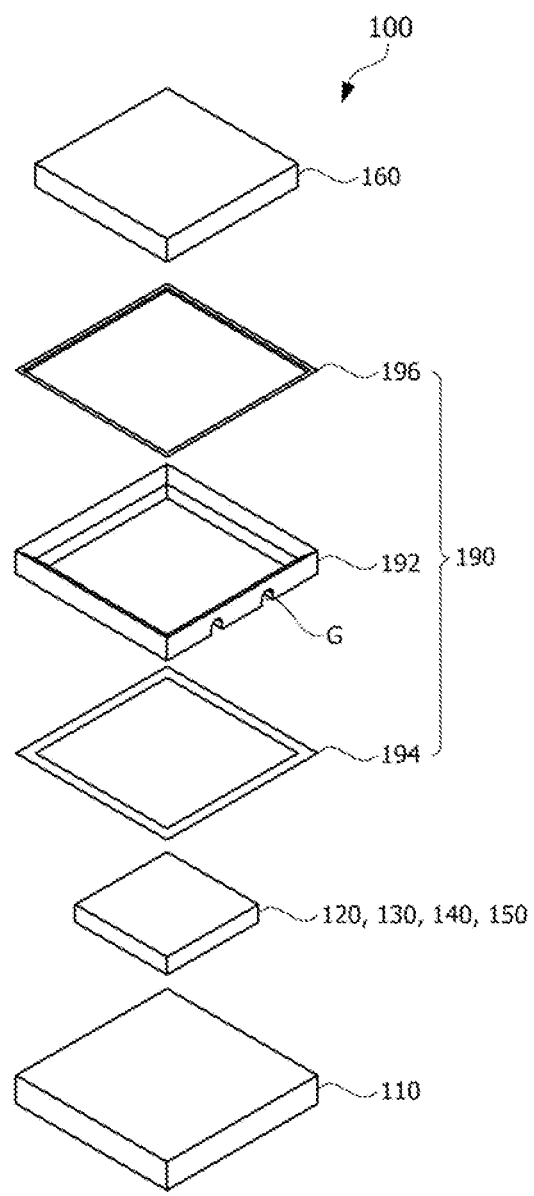

[FIG. 5]
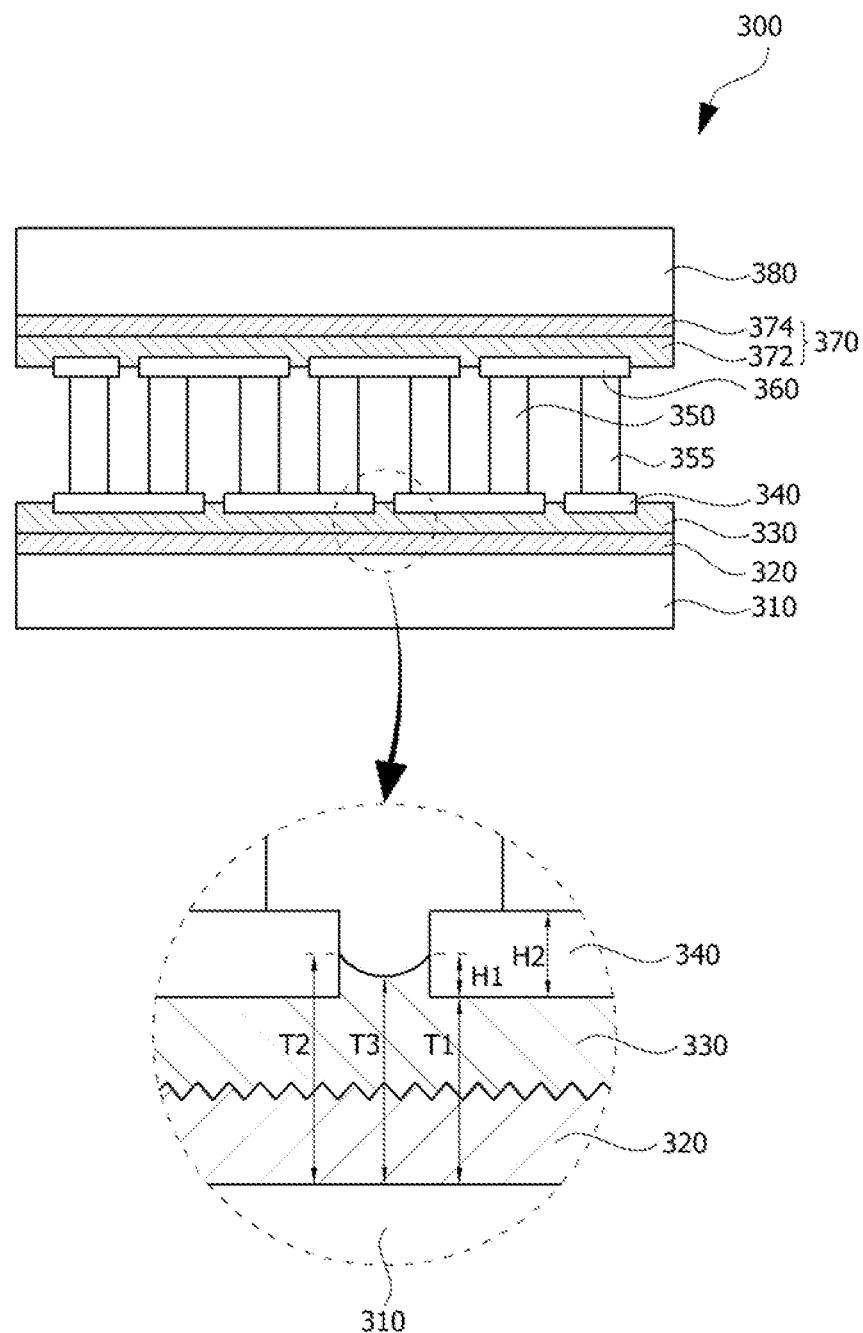

[FIG. 6]
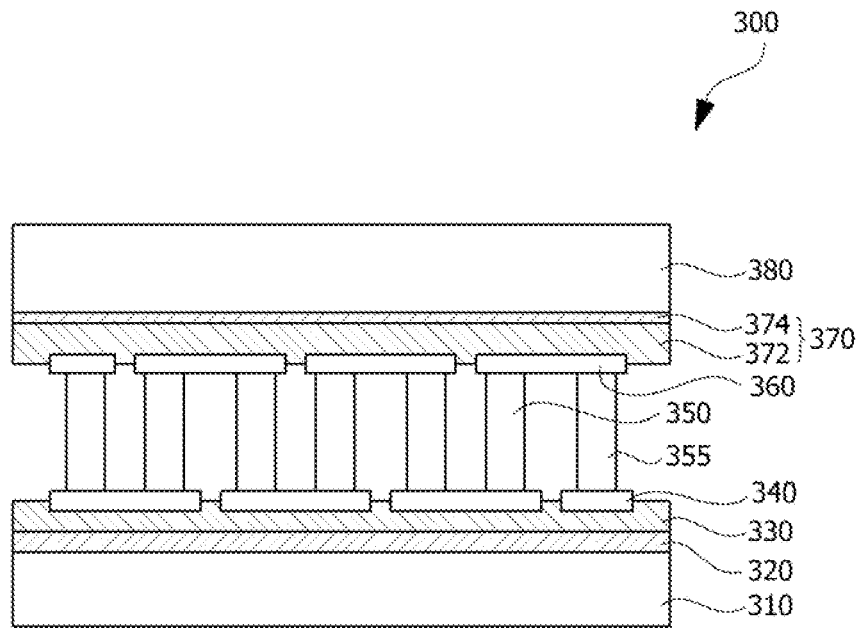
[FIG. 7]
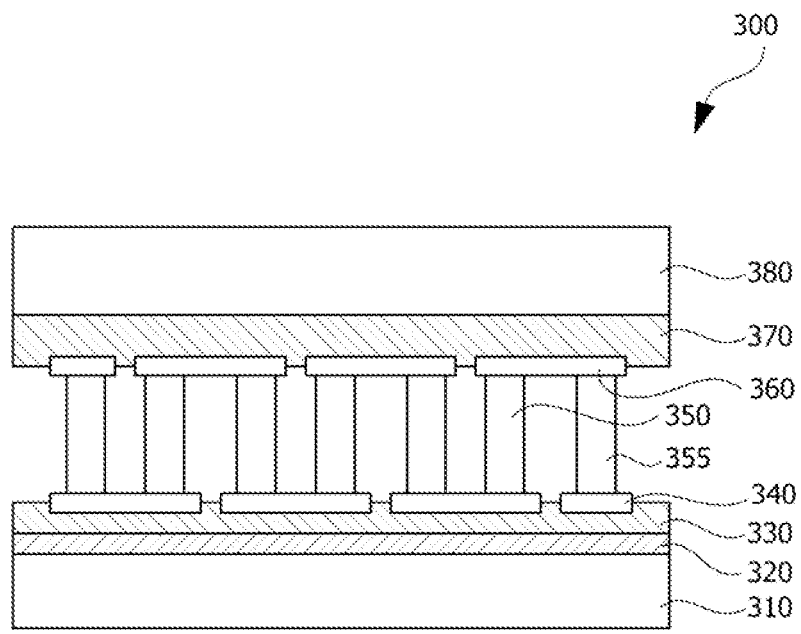

[FIG. 8a]
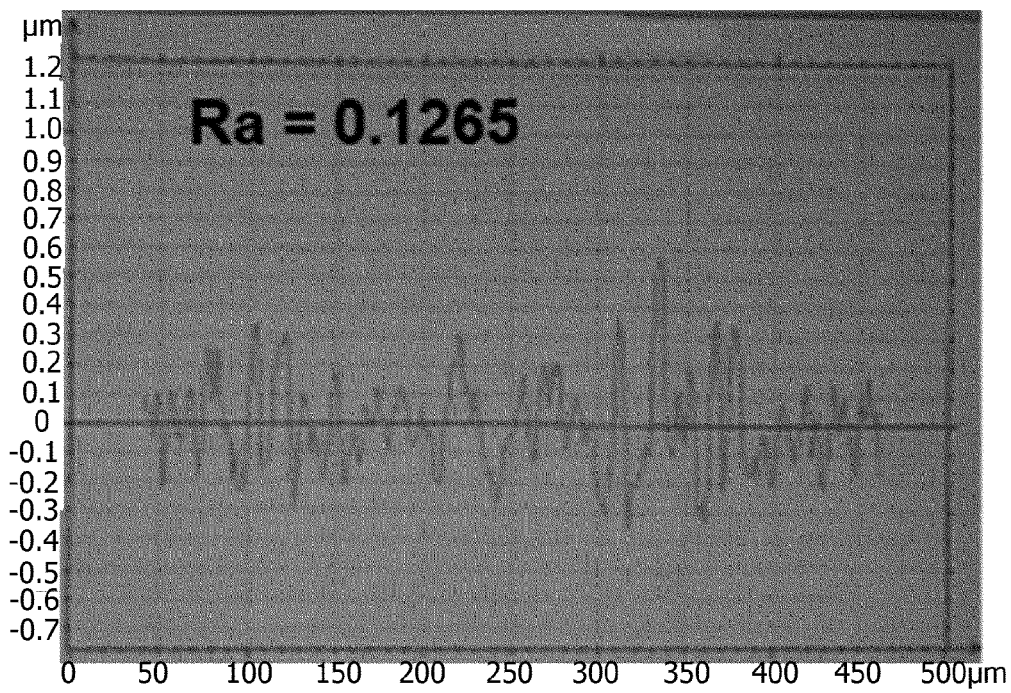
[FIG. 8b]
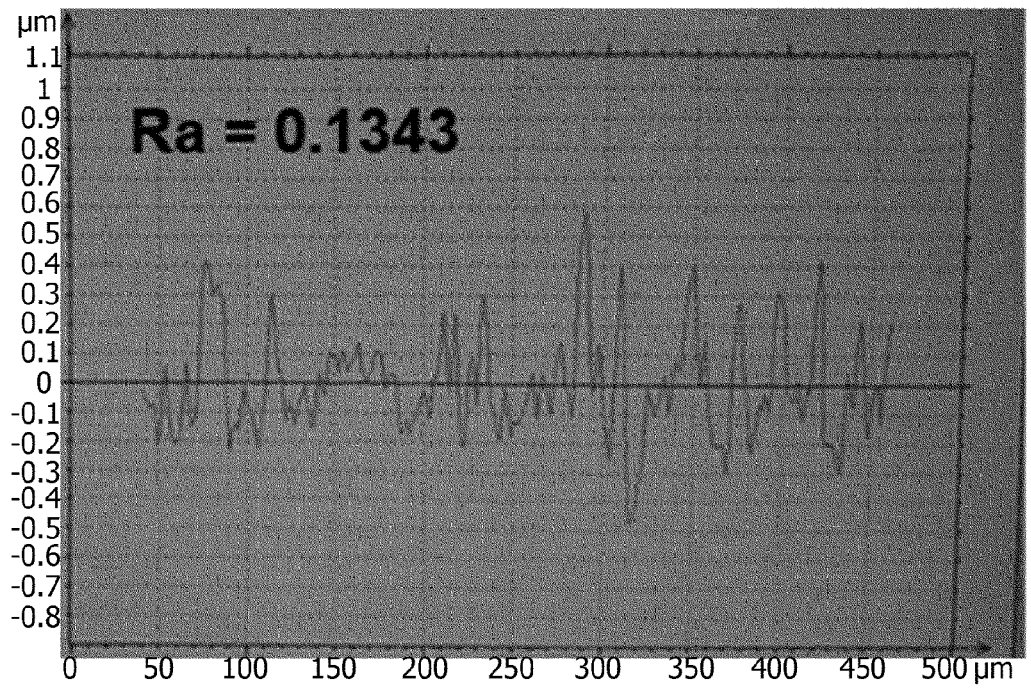

[FIG. 8c]
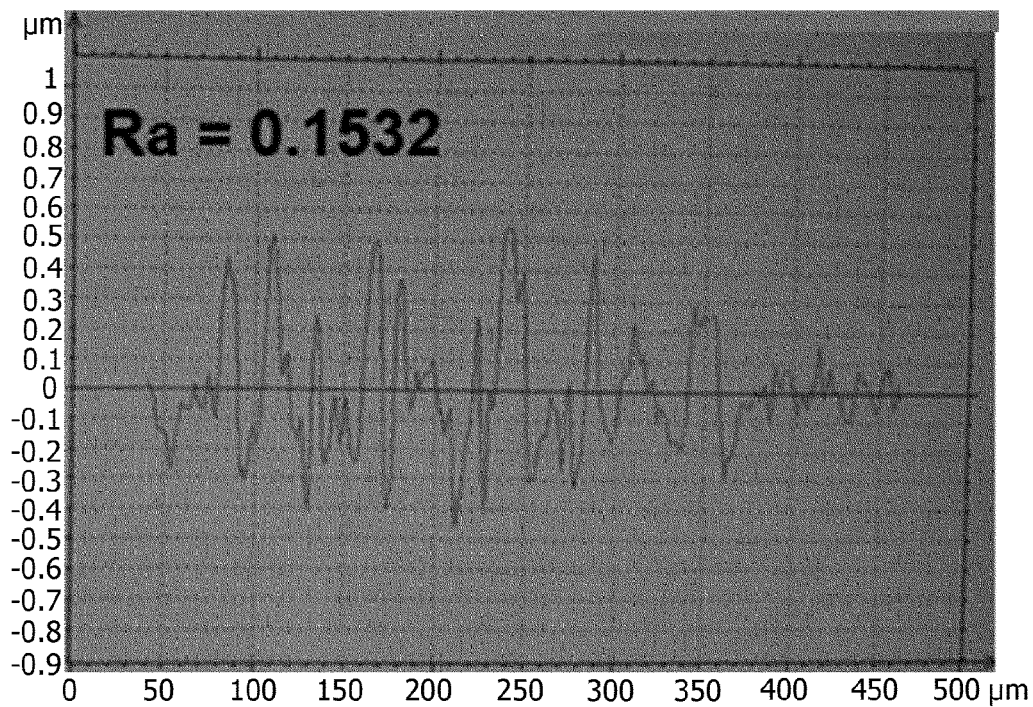
[FIG. 9a]
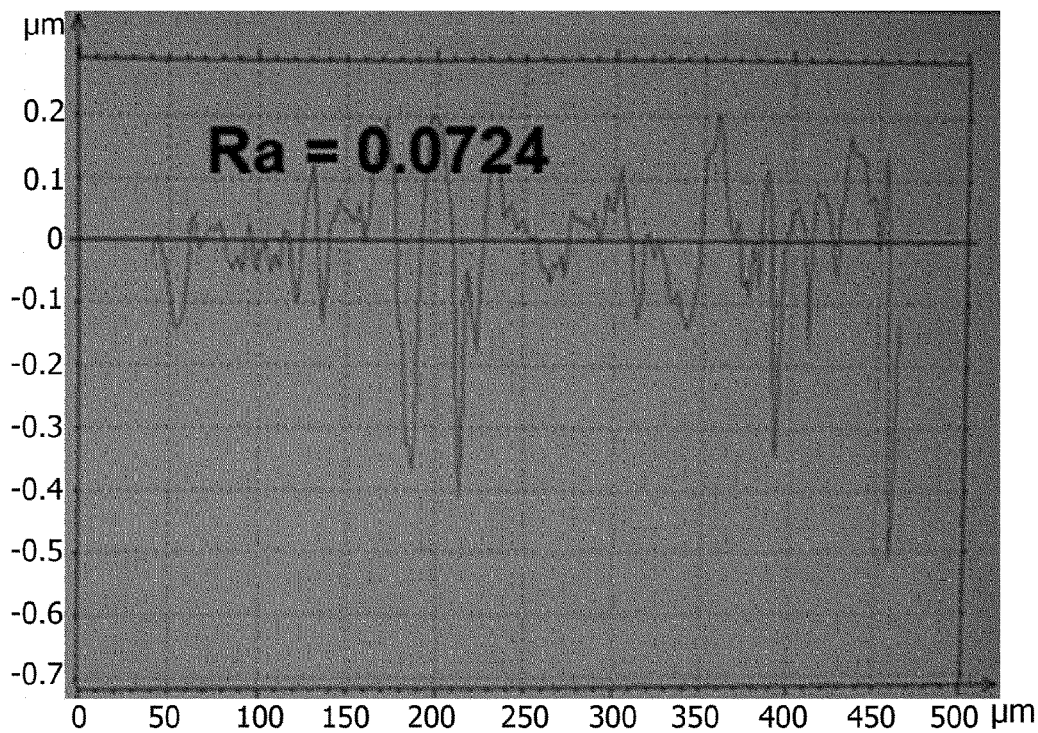

[FIG. 9b]
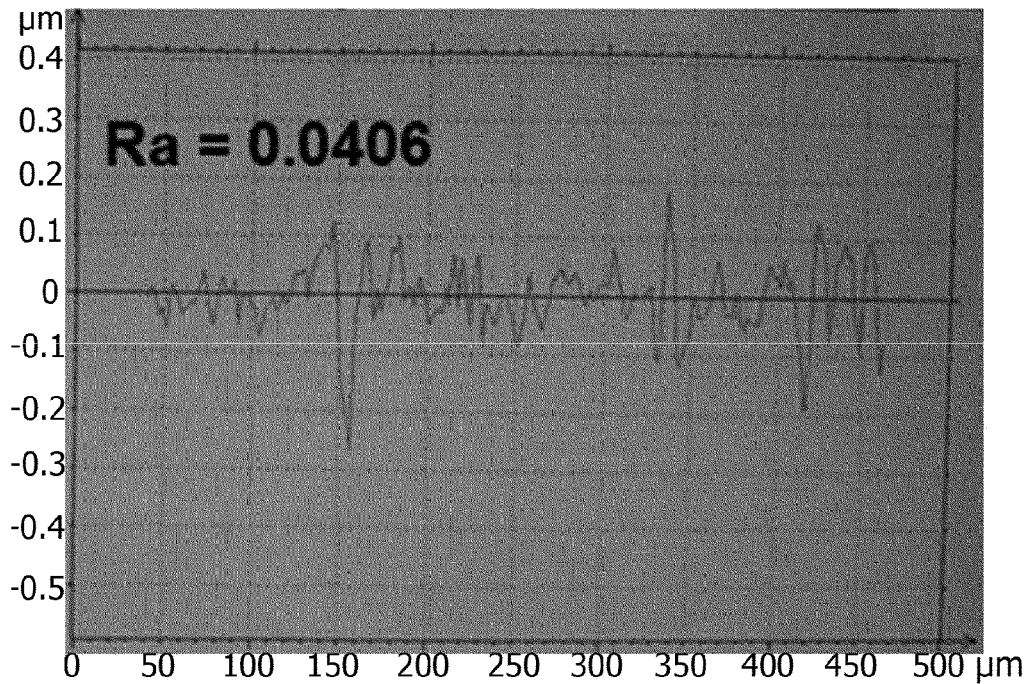
[FIG. 9c]
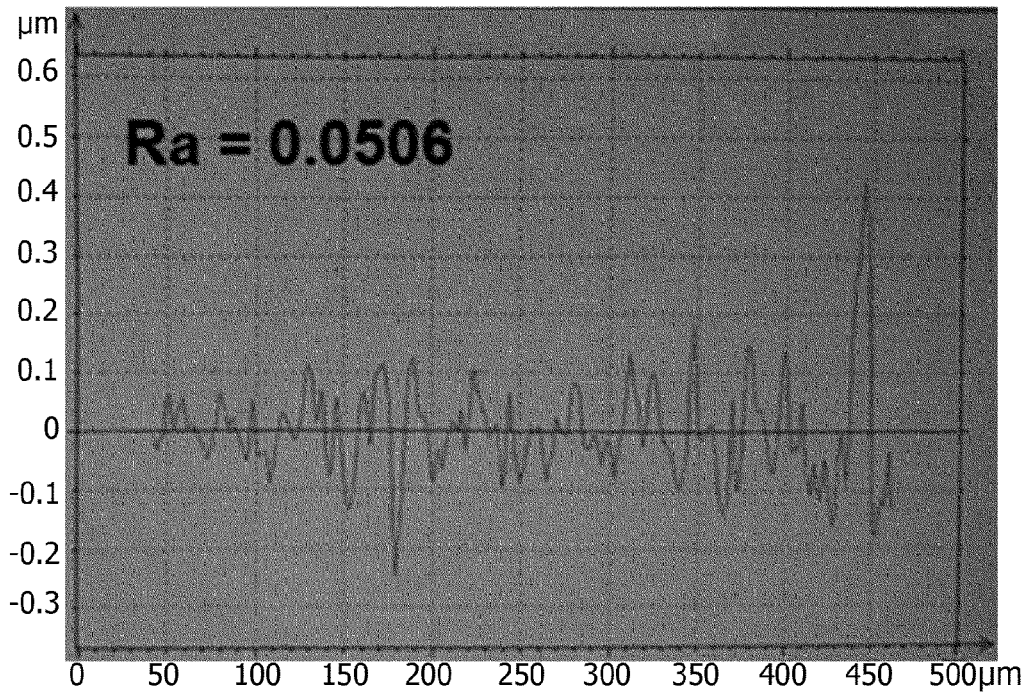

THERMOELECTRIC ELEMENT

CROSS REFERENCE TO RELATED APPLICATIONS

This application is the National Phase of PCT International Application No. PCT/KR2020/007827, filed on Jun. 17, 2020, which claims priority under 35 U.S.C. 119(a) to Patent Application No. 10-2019-0072192, filed in the Republic of Korea on Jun. 18, 2019, all of which are hereby expressly incorporated by reference into the present application.

TECHNICAL FIELD

The present disclosure relates to a thermoelectric element, and more particularly, to a substrate and an insulating layer of a thermoelectric element.

BACKGROUND ART

A thermoelectric phenomenon is a phenomenon occurring due to movement of electrons and holes in a material and means direct energy conversion between heat and electricity.

A thermoelectric element is a generic term for elements in which the thermoelectric phenomenon is used and has a structure in which P-type thermoelectric materials and N-type thermoelectric materials are joined between metal electrodes to form PN junction pairs.

The thermoelectric elements may be divided into elements which use a change in electrical resistance according to a change in temperature, elements which use the Seebeck effect in which an electromotive force is generated due to a difference in temperature, and elements which use the Peltier effect in which heat absorption or heating occurs due to a current.

The thermoelectric elements are being variously applied to home appliances, electronic components, communication components, and the like. For example, the thermoelectric elements may be applied to cooling devices, heating devices, power generation devices, and the like. Accordingly, the demand for thermoelectric performance of the thermoelectric elements is gradually increasing.

The thermoelectric element includes substrates, electrodes, and thermoelectric legs, wherein a plurality of thermoelectric legs are disposed between an upper substrate and a lower substrate, a plurality of upper electrodes are disposed between the upper substrate and the plurality of thermoelectric legs, and a plurality of lower electrodes are disposed between the plurality of thermoelectric legs and the lower substrate.

Attempts to use metal substrates to improve the heat transfer performance of the thermoelectric element are increasing.

In general, a thermoelectric element may be manufactured according to a process of sequentially stacking electrodes and thermoelectric legs on a metal substrate prepared in advance. When a metal substrate is used, an advantageous effect may be obtained in terms of thermal conduction, but there is a problem in that the reliability is lowered when the metal substrate is used for a long time due to a low withstand voltage.

In order to resolve such a problem, there is an attempt to increase a withstand voltage by anodizing the surface of an aluminum substrate, but there is a problem that it is difficult to bond the anodized metal substrate and electrodes.

Thus, there is a need for a thermoelectric element having improved thermal conduction performance as well as improved withstand voltage performance and bonding performance.

DISCLOSURE

Technical Problem

The present disclosure is directed to providing a structure of a substrate and an insulating layer of a thermoelectric element in which thermal conduction performance, withstand voltage performance, and bonding performance are all improved.

Technical Solution

According to an aspect of the present disclosure, there is provided a thermoelectric element including a first substrate, a first insulating layer disposed on the first substrate, a second insulating layer disposed on the first insulating layer, a first electrode disposed on the second insulating layer, and a semiconductor structure disposed on the first electrode, wherein the first insulating layer includes an uneven portion, a partial region of the first electrode is buried in the second insulating layer, the second insulating layer includes a concave portion which is concave in a direction toward the first insulating layer from a side surface of the first electrode, and the concave portion vertically overlaps the uneven portion.

At least one of a composition and an elasticity of the first insulating layer may be different from at least one of a composition and an elasticity of the second insulating layer, and a withstand voltage of the first insulating layer may be greater than a withstand voltage of the second insulating layer, and a thermal conductivity of the second insulating layer may be greater than a thermal conductivity of the first insulating layer.

The first insulating layer may include a composite containing silicon and aluminum, and the second insulating layer may be a resin layer made of a resin composition containing at least one of an epoxy resin and a silicone resin and an inorganic filler.

The composite may include at least one among an Al—Si bond, an Al—O—Si bond, a Si—O bond, an Al—Si—O bond, and an Al—O bond.

The uneven portion may be formed on a surface in contact with the second insulating layer among both surfaces of the first insulating layer and have a surface roughness (Ra) of 0.1 μm or more.

The first insulating layer may have a thickness of 20 μm to 35 μm.

The second insulating layer may have a thickness of 20 μm to 70 μm.

The concave portion may be disposed between two neighboring first electrodes, and a thickness of the second insulating layer may decrease from a side surface of each of the two neighboring first electrodes toward a central region between the two neighboring first electrodes.

A thickness of the second insulating layer disposed on the side surface of the first electrode may be greater than a thickness of the second insulating layer disposed on a lower surface of the first electrode.

The thermoelectric element may further include a second electrode disposed on the semiconductor structure, a third insulating layer disposed on the second electrode, and a second substrate disposed on the third insulating layer, wherein at least one of the first substrate and the second substrate may be made of at least one of aluminum, copper, an aluminum alloy, and a copper alloy.

Advantageous Effects

According to the embodiment of the present disclosure, a thermoelectric element with excellent performance and high reliability can be provided. In particular, according to the embodiment of the present disclosure, a thermoelectric element with improved thermal conduction performance as well as improved withstand voltage performance and bonding performance can be provided. According to the embodiment of the present disclosure, a thermoelectric element having a high bonding force between a substrate and an electrode as well as a high bonding force between the substrate and a heat sink can be provided.

A thermoelectric element according to the embodiment of the present disclosure can be applied to an application implemented in large size such as vehicles, vessels, a steel mill, an incinerator, and the like, as well as an application implemented in small size.

DESCRIPTION OF DRAWINGS

FIG. 1 is a cross-sectional view of a thermoelectric element;

FIG. 2 is a perspective view of the thermoelectric element;

FIG. 3 is a perspective view of the thermoelectric element including a sealing member;

FIG. 4 is an exploded perspective view of the thermoelectric element including the sealing member;

FIG. 5 is a cross-sectional view of a thermoelectric element according to an embodiment of the present disclosure;

FIG. 6 is a cross-sectional view of a thermoelectric element according to another embodiment of the present disclosure;

FIG. 7 is a cross-sectional view of a thermoelectric element according to still another embodiment of the present disclosure;

FIGS. 8A to 8C illustrate the results of measuring the surface roughness of an insulating layer according to Example; and FIGS. 9A to 9C illustrate the results of measuring the surface roughness of an insulating layer according to Comparative Example.

MODES OF THE INVENTION

Hereinafter, exemplary embodiments of the present disclosure will be described in detail with reference to the accompanying drawings.

However, the technical spirit of the present disclosure is not limited to some embodiments which will be described and may be embodied in various forms, and one or more elements in the embodiments may be selectively combined and replaced to be used within the scope of the technical spirit of the present disclosure.

Further, the terms used in the embodiments of the present disclosure (including technical and scientific terms), may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present disclosure are provided only to describe embodiments of the present disclosure and not for purposes of limitation.

In the present specification, unless clearly indicated otherwise by the context, singular forms include the plural forms thereof, and in a case in which "at least one (or one or more) among A, B, and C" is described, this may include at least one combination among all combinations which can be combined with A, B, and C.

In addition, terms such as first, second, A, B, (a), (b), and the like may be used to describe elements of the embodiments of the present disclosure.

These terms are only provided to distinguish the elements from other elements, and the essence, sequence, order, or the like of the elements are not limited by the terms.

In addition, when an element is described as being "connected," "coupled," or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, when an element is described as being disposed "on or under" another element, such a description may include a case in which the element is disposed at an upper side or a lower side with respect to another element.

FIG. 1 is a cross-sectional view of a thermoelectric element, and FIG. 2 is a perspective view of the thermoelectric element. FIG. 3 is a perspective view of the thermoelectric element including a sealing member, and FIG. 4 is an exploded perspective view of the thermoelectric element including the sealing member.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower bottom surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, a plurality of P-type thermoelectric legs 130 and a plurality of N-type thermoelectric legs 140 are electrically connected by the lower electrodes 120 and the upper electrodes 150. A pair of the P-type thermoelectric leg 130 and the N-type thermoelectric leg 140, which are disposed between the lower electrode 120 and the upper electrode 150 and electrically connected to each other, may form a unit cell.

For example, when a voltage is applied between the lower electrode 120 and the upper electrode 150 through lead wires 181 and 182, due to the Peltier effect, the substrate through which a current flows from the P-type thermoelectric leg 130 to the N-type thermoelectric leg 140 may absorb heat and thus serve as a cooling part, and the substrate through which a current flows from the N-type thermoelectric leg 140 to the P-type thermoelectric leg 130 may be heated and thus serve as a heating part. Alternatively, when a temperature difference is provided between the lower electrode 120 and the upper electrode 150, due to the Seebeck effect, charges in the P-type thermoelectric leg 130 and the N-type thermoelectric leg 140 move so that electricity may be produced.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb—Te-based main raw material in a range of 99 to 99.999 wt % and a material containing at least one among Ni, Al, Cu, Ag, Pb, B, Ga, and In in a range of 0.001 to 1 wt % based on a total weight of 100 wt %. The N-type thermoelectric leg 140 may be a Bi—Te-based thermoelectric leg including at least one among selenium (Se), Ni, Al, Cu, Ag, Pb, B, Ga, Te, Bi, and In. For example, the N-type thermoelectric leg 140 may include a Bi—Se—Te-based main raw material in a range of 99 to 99.999 wt % and a material containing at least one among Ni, Al, Cu, Ag, Pb, B, Ga, and In in a range of 0.001 to 1 wt % based on a total weight of 100 wt %.

Accordingly, the thermoelectric leg may be referred to herein as a semiconductor structure, a semiconductor device, a semiconductor material layer, a thermoelectric structure, a thermoelectric material layer, a thermoelectric semiconductor structure, a thermoelectric semiconductor device, a thermoelectric semiconductor material layer, or the like.

The P-type thermoelectric leg 130 and the N-type thermoelectric leg 140 may be formed as a bulk type or a stacked type. Generally, the bulk type P-type thermoelectric leg 130 or the bulk type N-type thermoelectric leg 140 may be obtained through a process of performing a thermal process on a thermoelectric material to manufacture an ingot, crushing and sieving the ingot to obtain a powder for a thermoelectric leg, sintering the powder, and cutting a sintered body. Here, the P-type thermoelectric leg 130 and the N-type thermoelectric leg 140 may be polycrystalline thermoelectric legs. In order to obtain the polycrystalline thermoelectric legs, the powder for a thermoelectric leg may be compressed at a pressure of 100 MPa to 200 MPa when sintered. For example, when the P-type thermoelectric leg 130 is sintered, the powder for a thermoelectric leg may be sintered at a pressure of 100 to 150 MPa, preferably 110 to 140 MPa, and more preferably 120 to 130 MPa. In addition, when the N-type thermoelectric leg 140 is sintered, the powder for a thermoelectric leg may be sintered at a pressure of 150 to 200 MPa, preferably 160 to 195 MPa, and more preferably 170 to 190 MPa. As described above, when the P-type thermoelectric leg 130 and the N-type thermoelectric leg 140 are polycrystalline thermoelectric legs, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of coating a sheet-shaped base with a paste including a thermoelectric material to form unit members, stacking the unit members, and cutting the stacked unit members.

In this case, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or sectional area of the N-type thermoelectric leg 140 may be formed to be different from that of the P-type thermoelectric leg 130.

Here, the P-type thermoelectric leg 130 or the N-type thermoelectric leg 140 may have a cylindrical shape, a polygonal column shape, an elliptical column shape, or the like.

Alternatively, the P-type thermoelectric leg 130 or the N-type thermoelectric leg 140 may have a stacked type structure. For example, the P-type thermoelectric leg or the N-type thermoelectric leg may be formed by a method of stacking a plurality of structures each having a sheet-shaped base coated with a semiconductor material and then cutting the plurality of structures. Accordingly, it is possible to prevent the loss of a material and improve electrical conduction properties. Each of the structures may further include a conductive layer having an opening pattern, thereby increasing adhesion between the structures, lowering thermal conductivity, and increasing electrical conductivity.

Alternatively, the P-type thermoelectric leg 130 or the N-type thermoelectric leg 140 may be formed such that sectional areas thereof are different within one thermoelectric leg. For example, in one thermoelectric leg, sectional areas of both end portions each disposed to face the electrode may be formed to be greater than a sectional area between the both end portions. Accordingly, a great temperature difference may be formed between the both end portions, and thus thermoelectric efficiency may be improved.

Performance of the thermoelectric element according to one embodiment of the present disclosure may be represented by a figure of merit ZT. The figure of merit ZT may be expressed by Equation 1.

$$ZT = \alpha^2 \cdot \sigma \cdot T/k \qquad \text{[Equation 1]}$$

where α is the Seebeck coefficient [V/K], σ is electrical conductivity [S/m], and $\alpha^2 \sigma$ is a power factor [W/mK$^2$]. In addition, T is temperature and k is thermal conductivity [W/mK]. k may be expressed as a·cp·ρ, wherein a is thermal diffusivity [cm$^2$/S], cp is specific heat [J/gK], and ρ is density [g/cm$^3$].

In order to obtain a figure of merit of a thermoelectric element, a Z value [V/K] is measured using a Z meter, and the figure of merit ZT may be calculated using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may include at least one among Cu, Ag, Al, and Ni and have a thickness of 0.01 mm to 0.3 mm. When the thickness of the lower electrode 120 or the upper electrode 150 is less than 0.01 mm, the function thereof as an electrode decrease and thus electrical conduction performance may be degraded, and, when the thickness thereof exceeds 0.3 mm, conduction efficiency may be degraded due to an increase in resistance.

In addition, the lower substrate 110 and the upper substrate 160 facing each other may be metal substrates and may have a thickness of 0.1 mm to 1.5 mm. When the thickness of the metal substrate is less than 0.1 mm or exceeds 1.5 mm, a heat radiation characteristic or thermal conductivity may be excessively increased so that the reliability of the thermoelectric element may be decreased. In addition, when the lower substrate 110 and the upper substrate 160 are metal substrates, an insulating layer 170 may be further formed between the lower substrate 110 and the lower electrodes 120 and between the upper substrate 160 and the upper electrodes 150. The insulating layer 170 may include a material having a thermal conductivity of 1 to 20 W/mK.

In this case, the lower substrate 110 and the upper substrate 160 may be formed to have different sizes. For example, a volume, a thickness, or an area of one of the lower substrate 110 and the upper substrate 160 may be formed to be greater than that of the other one thereof. Accordingly, heat absorption performance or heat dissipation performance of the thermoelectric element may be improved. Preferably, at least one of the volume, the thickness, or the area of the lower substrate 110 may be formed to be greater than that of the upper substrate 160. Here, in a case in which the lower substrate 110 is disposed in a high-temperature region for the Seebeck effect, the lower substrate 110 is applied as a heating region for the Peltier effect, or a sealing member for protecting a thermoelectric module, which will be described later, from the external environment is disposed on the lower substrate 110, at least one of the volume, the thickness, or the area of the lower substrate 110 may be greater than that of the upper substrate 160. In this case, the area of the lower substrate 110 may be formed in a range of 1.2 to 5 times the area of the upper substrate 160. When the area of the lower substrate 110 is formed to be less than 1.2 times that of the upper substrate 160, the effect of improving heat transfer efficiency is not great, and when the area of the lower substrate 110 is formed to be more than 5 times that of the upper substrate 160, the heat transfer efficiency is significantly reduced, and the basic shape of the thermoelectric module may be difficult to maintain.

In addition, a heat dissipation pattern, for example, an irregular pattern, may be formed on a surface of at least one of the lower substrate 110 and the upper substrate 160. Accordingly, the heat dissipation performance of the thermoelectric element may be improved. In a case in which the irregular pattern is formed on a surface in contact with the P-type thermoelectric leg 130 or N-type thermoelectric leg 140, a bonding property between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

As illustrated in FIGS. 3 to 4, a sealing member 190 may be disposed between the lower substrate 110 and the upper substrate 160. The sealing member may be disposed on side surfaces of the lower electrodes 120, the P-type thermoelectric legs 130, the N-type thermoelectric legs 140, and the upper electrodes 150 between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, contamination, and the like. Here, the sealing member 190 may include a sealing case 192 disposed to be spaced apart by a predetermined distance from the outermost side of the plurality of lower electrodes 120, the outermost side of the plurality of P-type thermoelectric legs 130 and the plurality of N-type thermoelectric legs 140, and the outermost side of the plurality of upper electrodes 150, a sealing material 194 disposed between the sealing case 192 and the lower substrate 110, and a sealing material 196 disposed between the sealing case 192 and the upper substrate 160. As described above, the sealing case 192 may be in contact with the lower substrate 110 and the upper substrate 160 through the sealing materials 194 and 196. Accordingly, a problem may be prevented in which thermal conduction occurs through the sealing case 192 when the sealing case 192 is in direct contact with the lower substrate 110 and the upper substrate 160, and as a result, the temperature difference between the lower substrate 110 and the upper substrate 160 is lowered. Here, the sealing materials 194 and 196 may include at least one of an epoxy resin and a silicone resin or may include a tape having both sides on which at least one of an epoxy resin and a silicone resin is applied. The sealing materials 194 and 194 may serve to hermetically seal between the sealing case 192 and the lower substrate 110 and between the sealing case 192 and the upper substrate 160, may improve the effect of sealing the lower electrodes 120, the P-type thermoelectric legs 130, the N-type thermoelectric legs 140, and the upper electrodes 150, and may be mixed with a finishing material, a finishing layer, a waterproof material, a waterproof layer, and the like. Here, the sealing material 194 that seals between the sealing case 192 and the lower substrate 110 may be disposed on an upper surface of the lower substrate 110, and the sealing material 196 that seals between the sealing case 192 and the upper substrate 160 may be disposed on side surfaces of the upper substrate 160. To this end, the area of the lower substrate 110 may be greater than that of the upper substrate 160. Meanwhile, guide grooves G for leading the lead wires 180 and 182 connected to the electrodes may be formed in the sealing case 192. To this end, the sealing case 192 may be an injection molded product made of plastic or the like and may be used with a sealing cover. However, the above description of the sealing member is merely exemplary, and the sealing member may be modified in various forms. Although not illustrated in the drawing, a heat-insulating material may be further included to surround the sealing member. Alternatively, the sealing member may include a heat-insulating component.

Meanwhile, the P-type thermoelectric leg 130 and the N-type thermoelectric leg 140 may have a structure shown in FIG. 1A or 1B. Referring to FIG. 1A, the thermoelectric legs 130 and 140 may respectively include thermoelectric material layers 132 and 142, first plated layers 134-1 and 144-1 stacked on one surfaces of the thermoelectric material layers 132 and 142, and the second plated layers 134-2 and 144-2 stacked on the other surfaces of the thermoelectric material layers 132 and 142, which are opposite to the one surfaces. Alternatively, referring to FIG. 1B, the thermoelectric legs 130 and 140 may respectively include thermoelectric material layers 132 and 142, first plated layers 134-1 and 144-1 stacked on one surfaces of the thermoelectric material layers 132 and 142, second plated layers 134-2 and 144-2 stacked on the other surfaces of the thermoelectric material layers 132 and 142, which are opposite to the one surfaces, first buffer layers 136-1 and 146-1 respectively disposed between the thermoelectric material layers 132 and 142 and the first plated layers 134-1 and 144-1, and second buffer layers 136-2 and 146-2 respectively disposed between the thermoelectric material layers 132 and 142 and the second plated layers 134-2 and 144-2. Alternatively, the thermoelectric legs 130 and 140 may further include metal layers stacked between the lower substrate 110 and each of the first plated layers 134-1 and 144-1 and between the upper substrate 160 and each of the second plated layers 134-2 and 144-2.

Here, the thermoelectric material layers 132 and 142 may include Bi and Te which are semiconductor materials. The thermoelectric material layers 132 and 142 may have the same material or shape as the P-type thermoelectric leg 130 or the N-type thermoelectric leg 140 described above. When the thermoelectric material layers 132 and 142 are polycrystalline, the bonding force between the thermoelectric material layers 132 and 142, the first buffer layers 136-1 and 146-1, and the first plated layers 134-1 and 144-1, and the bonding force between the thermoelectric material layers 132 and 142, the second buffer layers 136-2 and 146-2, and the second plated layers 134-2 and 144-2 may be enhanced. Accordingly, even when the thermoelectric element 100 is applied to an application in which vibration occurs, for example, a vehicle or the like, the problem that the first plated layer 134-1 or 144-1 and the second plated layer 134-2 or 144-2 are separated from the P-type thermoelectric leg 130 or the N-type thermoelectric leg 140 and thus carbonized may be prevented, thereby improving the durability and reliability of the thermoelectric element 100.

In addition, the metal layer may be formed of one selected from among Cu, a copper alloy, Al, and an aluminum alloy, and may have a thickness of 0.1 to 0.5 mm, and preferably 0.2 to 0.3 mm.

Next, each of the first plated layers 134-1 and 144-1 and the second plated layers 134-2 and 144-2 may include at least one among Ni, Sn, Ti, Fe, Sb, Cr, and Mo and may have a thickness of 1 to 20 μm, and preferably, 1 to 10 μm. The first plated layers 134-1 and 144-1 and the second plated layers 134-2 and 144-2 prevent a reaction between Bi or Te, which is the semiconductor material of the thermoelectric material layers 132 and 142, and the metal layer, so that performance degradation of the thermoelectric element may be prevented, and oxidization of the metal layer may also be prevented.

Here, the first buffer layers 136-1 and 146-1 may be disposed between the thermoelectric material layers 132 and 142 and the first plated layers 134-1 and 144-1, respectively, and the second buffer layers 136-2 and 146-2 may be disposed between the thermoelectric material layers 132 and 142 and the second plated layers 134-2 and 144-2, respectively. In this case, the first buffer layers 136-1 and 146-1 and the second buffer layers 136-2 and 146-2 may each include Te. For example, each of the first buffer layers 136-1 and 146-1 and the second buffer layers 136-2 and 146-2 may include at least one among Ni—Te, Sn—Te, Ti—Te, Fe—Te, Sb—Te, Cr—Te, and Mo—Te. According to the embodiment of the present disclosure, when the first buffer layers 136-1 and 146-1 including Te are disposed between the thermoelectric material layers 132 and 142 and the first plated layers 134-1 and 144-1, respectively, and the second buffer layers 136-2 and 146-2 including Te are disposed between the thermoelectric material layers 132 and 142 and the second plated layer 134-2 or 144-2, respectively, Te in the thermoelectric material layers 132 and 142 may be prevented from diffusing into the first plated layers 134-1 and 144-1 and the second plated layers 134-2 and 144-2. Accordingly, the problem of increasing the electrical resistance in the thermoelectric material layer due to a Bi-rich region may be prevented.

Although the terms the "lower substrate 110," the "lower electrode 120," the "upper electrode 150," and the "upper substrate 160" are used in the above, they are arbitrarily referred to as "upper" and "lower" for ease of understanding and convenience of description, and thus it is understood that the positions may be reversed such that the lower substrate 110 and the lower electrode 120 are disposed on the upper side and the upper electrode 150 and the upper substrate 160 may be disposed on the lower side.

FIG. 5 is a cross-sectional view of a thermoelectric element according to an embodiment of the present disclosure, FIG. 6 is a cross-sectional view of a thermoelectric element according to another embodiment of the present disclosure, and FIG. 7 is a cross-sectional view of a thermoelectric element according to still another embodiment of the present disclosure. Repetitive descriptions of contents which are the same as those described above with respect to FIGS. 1 to 4 will be omitted.

Referring to FIGS. 5 to 7, a thermoelectric element 300 according to the embodiments of the present disclosure includes a first substrate 310, a first insulating layer 320 disposed on the first substrate 310, a second insulating layer 330 disposed on the first insulating layer 320, a plurality of first electrodes 340 disposed on the second insulating layer 330, a plurality of P-type thermoelectric legs 350 and a plurality of N-type thermoelectric legs 355 disposed on the plurality of first electrodes 340, a plurality of second electrodes 360 disposed on the plurality of P-type thermoelectric legs 350 and the plurality of N-type thermoelectric legs 355, a third insulating layer 370 disposed on the plurality of second electrodes 360, and a second substrate 380 disposed on the third insulating layer 370. Although not illustrated in the drawing, a heat sink may be further disposed on the first substrate 310 or the second substrate 380. Although not illustrated in the drawing, a sealing member may be further disposed between the first substrate 310 and the second substrate 380. Although not illustrated in the drawing, power may be connected to the first electrodes 340 or the second electrodes 360, and wires may be led through the insulating layer and the substrate or may be led laterally on the substrate and the insulating layer.

Here, the first electrode 340, the P-type thermoelectric leg 350, the N-type thermoelectric leg 360, and the second electrode 370 may respectively correspond to the upper electrode 120, the P-type thermoelectric leg 130, the N-type thermoelectric leg 140, and the lower electrode 150 described with reference to FIGS. 1 and 2, and the contents described with reference to FIGS. 1 and 2 may be applied in the same or similar manner.

At least one of the first substrate 310 and the second substrate 380 may be made of at least one among aluminum, an aluminum alloy, copper, and a copper alloy. The first substrate 310 and the second substrate 380 may be made of different materials. For example, among the first substrate 310 and the second substrate 320, the substrate requiring a higher withstand voltage performance may be formed of an aluminum substrate, and the substrate requiring a higher thermal conduction performance may be formed of a copper substrate.

The withstand voltage performance according to the embodiment of the present disclosure may mean a characteristic that is maintained without dielectric breakdown for 10 seconds under an AC voltage of 2.5 kV and a current of 1 mA. In the present specification, the withstand voltage performance was measured by disposing an insulating layer on a substrate, connecting one terminal to the substrate, connecting other terminals to nine points of the insulating layer, and testing whether the characteristic is maintained without dielectric breakdown for 10 seconds under an AC voltage of 2.5 kV and a current of 1 mA.

Meanwhile, according to the embodiment of the present disclosure, a two-layer insulating layer may be disposed between the first substrate 310 and the first electrode 340. That is, the first insulating layer 320 may be disposed on the first substrate 310, the second insulating layer 330 may be disposed on the first insulating layer 320, and the first electrodes 340 may be disposed on the second insulating layer 330. In this case, one surface of the first insulating layer 320 may be in direct contact with the first substrate 310, and the other surface of the first insulating layer 320 may be in direct contact with the second insulating layer 330. In addition, the second insulating layer 330 may be in direct contact with the first electrodes 340.

Here, the first insulating layer 320 and the second insulating layer 330 may have different compositions and elasticity. That is, the first insulating layer 320 may be formed of a composition having insulating performance and thermal conduction performance, and the second insulating layer 330 may be formed of a composition having bonding performance and thermal shock mitigation performance together with the insulating performance and the thermal conduction performance. Further, both the first insulating layer 320 and the second insulating layer 330 may have insulating performance and thermal conduction performance, and withstand voltage performance of the first insulating layer 320 may be higher than that of the second insulating layer 330, and the thermal conduction performance of the second insulating layer 330 may be higher than that of the first insulating layer 320. Here, the relatively high withstand voltage performance may mean that a characteristic is maintained for a relatively long time without dielectric breakdown under an AC voltage of 2.5 kV and a current of 1 mA.

To this end, the first insulating layer 320 may include a composite containing silicon and aluminum. Here, the composite may be at least one among an oxide, a carbide, and a nitride which contains silicon and aluminum. For example, the composite may include at least one among an Al—Si bond, an Al—O—Si bond, a Si—O bond, an Al—Si—O bond, and an Al—O bond. The composite containing at least one among the Al—Si bond, the Al—O—Si bond, the Si—O bond, the Al—Si—O bond, and the Al—O bond as described above has an excellent insulating performance and thus may achieve high withstand voltage performance. Alternatively, the composite may be an oxide, a carbide, or a nitride further including titanium, zirconium, boron, zinc, and the like together with silicon and aluminum. To this end, the composite may be obtained through a process of mixing aluminum with at least one of an inorganic binder and an organic-inorganic hybrid binder and then heat-treating. The inorganic binder may include at least one among, for example, silica ($SiO_2$), metal alkoxide, boron oxide ($B_2O_3$), and zinc oxide ($ZnO_2$). The inorganic binder may be inorganic particles and may act as a binder by being solated or gelled when coming into contact with water. In this case, at least one of the silica ($SiO_2$), the metal alkoxide, and the boron oxide ($B_2O_3$) may serve to increase the adhesion between aluminum, or the adhesion to the first insulating layer 320, and the zinc oxide ($ZnO_2$) may serve to increase the strength of the first insulating layer 320 and increase the thermal conductivity.

Here, the composite may be included in an amount of at least 80 wt %, preferably at least 85 wt %, and more preferably at least 90 wt % of the entire first insulating layer 320.

Here, the first insulating layer 320 may include an uneven portion. For example, a surface roughness Ra of 0.1 μm or more may be formed in the first insulating layer 320. The surface roughness may be formed by protruding particles forming the composite from the surface of the first insulating layer 320 and may be measured using a surface roughness measuring device. The surface roughness measuring device may be provided to measure cross-section curves using a probe and calculate the surface roughness using a peak line, a valley bottom line, an average line, and a reference length of the cross-section curves. In the present specification, the surface roughness may mean an arithmetic average roughness Ra obtained by a method of calculating the centerline average. The arithmetic average roughness Ra may be obtained through Equation 2 below.

$$R_a = \frac{1}{L}\int_0^L |f(x)|dx \qquad \text{[Equation 2]}$$

That is, when the cross-section curve obtained by the probe of the surface roughness measuring device is extracted by as much as the reference length L and expressed as the function (f(x)) with an average line direction set to an x-axis and a height direction set to a y-axis, the value obtained by Equation 2 may be expressed in μm.

Here, the uneven portion of the first insulating layer 320 may be formed on the surface of the first insulating layer 320, which is in contact with the second insulating layer 330. As described above, when the surface roughness Ra of the first insulating layer 320 is 0.1 μm or more, the contact area with the second insulating layer 330 is widened, thereby increasing the bonding strength between the first insulating layer 320 and the second insulating layer 330. In particular, as will be described below, when the second insulating layer 330 is formed of a resin layer, the resin layer of the second insulating layer 330 may penetrate between grooves formed by the surface roughness of the first insulating layer 320, so that the bonding strength between the first insulating layer 320 and the second insulating layer 330 may be further increased.

Here, the first insulating layer 320 may be formed on the first substrate 310 through a wet process. Here, the wet process may be a spray coating process, a dip coating process, a screen printing process, or the like. Accordingly, the thickness of the first insulating layer 320 may be easily controlled, and composites of various compositions may be applied.

According to the embodiment of the present disclosure, the first insulating layer 320 is made of a composite containing silicon and aluminum and is formed through a wet process so that the surface roughness may be formed to be 0.1 μm or more. FIGS. 8A to 8C are graphs illustrating the results of measuring surface roughness of three samples in which the first insulating layer 320 is formed on the aluminum substrate according to the embodiment of the present disclosure, and FIGS. 9A to 9C are graphs illustrating the results of measuring surface roughness of three samples in which an aluminum substrate is anodized. Referring to FIGS. 8A to 8C and FIGS. 9A to 9C, it can be seen that the surface roughness of the first insulating layer according to the embodiment of the present disclosure may be formed to be 0.1 μm or more.

Meanwhile, the second insulating layer 330 may be formed of a resin layer including at least one of an epoxy resin composition containing an epoxy resin and an inorganic filler and a silicone resin composition containing polydimethylsiloxane (PDMS). Accordingly, the second insulating layer 330 may improve an insulation property, a bonding force, and thermal conduction performance between the first insulating layer 320 and the first electrode 340.

Here, the inorganic filler may be included in an amount of 60 to 80 wt % of the resin layer. When the inorganic filler is included at less than 60 wt %, the thermal conduction effect may be reduced, and when the inorganic filler is included at more than 80 wt %, the inorganic filler may be difficult to uniformly disperse in the resin and the resin layer may be easily broken.

In addition, the epoxy resin may include an epoxy compound and a curing agent. In this case, the curing agent may be included in a volume ratio of 1 to 10 with respect to a volume ratio of 10 of the epoxy compound. Here, the epoxy compound may include at least one among a crystalline epoxy compound, an amorphous epoxy compound, and a silicone epoxy compound. The inorganic filler may include at least one of aluminum oxide and nitride. When the inorganic filler includes nitride, the nitride may be included in an amount of 55 to 95 wt % of the inorganic filler, and more preferably 60 to 80 wt %. When the nitride is included in the above numerical range, thermal conductivity and bonding strength may be increased. Here, the nitride may include at least one of boron nitride and aluminum nitride.

In this case, a particle size D50 of a boron nitride aggregate may be in a range of 250 to 350 μm, and a particle size D50 of the aluminum oxide may be in a range of 10 to 30 μm. When the particle size D50 of the boron nitride aggregate and the particle size D50 of the aluminum oxide satisfy the above numerical range, the boron nitride aggregate and the aluminum oxide may be uniformly dispersed in the resin layer, and accordingly, the entire resin layer may have uniform thermal conduction effect and bonding performance.

When the second insulating layer 330 is a resin composition containing PDMS resin and aluminum oxide, the content (e.g., weight ratio) of silicon in the first insulating layer 320 may be greater than that of silicon in the second insulating layer 330, and the content of aluminum in the second insulating layer 330 may be greater than that of aluminum in the first insulating layer 320. Accordingly, the silicon in the first insulating layer 320 may mainly contribute to the improvement of the withstand voltage performance, and the aluminum oxide in the second insulating layer 330 may mainly contribute to the improvement of the thermal conduction performance. Thus, although both the first insulating layer 320 and the second insulating layer 330 have the insulating performance and the thermal conduction performance, the withstand voltage performance of the first insulating layer 320 may be higher than that of the second insulating layer 330, and the thermal conduction performance of the second insulating layer 330 may be higher than that of the first insulating layer 320.

Meanwhile, the second insulating layer 330 may be formed through a method of coating the first insulating layer 320 with a resin composition in a non-cured state or a semi-cured state and then disposing a plurality of pre-aligned first electrodes 340 followed by pressurizing. Accordingly, the resin composition forming the second insulating layer 330 may penetrate into grooves generated due to the surface roughness Ra of the first insulating layer 320, thereby increasing the bonding strength between the first insulating layer 320 and the second insulating layer 330. In addition, a portion of side surfaces of the plurality of first electrodes 340 may be buried in the second insulating layer 330. In this case, a height H1 of the side surfaces of the plurality of first electrodes 340 buried in the second resin layer 330 may be 0.1 to 1.0 times, preferably 0.2 to 0.9 times, and more preferably 0.3 to 0.8 times a thickness H of the plurality of first electrodes 340. As described above, when a portion of the side surfaces of the plurality of first electrodes 340 is buried in the second insulating layer 330, the contact area between the plurality of first electrodes 340 and the second insulating layer 330 is widened, and thus the heat transfer performance and the bonding strength between the plurality of first electrodes 340 and the second insulating layer 330 may be further increased. When the height H1 of the side surfaces of the plurality of first electrodes 340 buried in the second insulating layer 330 is less than 0.1 times the thickness H of the plurality of first electrodes 340, it may be difficult to obtain sufficient heat transfer performance and bonding strength between the plurality of first electrodes 340 and the second insulating layer 330, and when the height H1 of the side surfaces of the plurality of first electrodes 340 buried in the second insulating layer 330 exceeds 1.0 times the thickness H of the plurality of first electrodes 340, the second insulating layer 330 may rise over the plurality of first electrodes 340 and thus there is a possibility of an electrical short circuit.

In more detail, the second insulating layer 330 may include a concave portion that is concave in a direction toward the first electrode 320 from the side surface of the first electrode 340. In this case, the concave portion is disposed between the two neighboring first electrodes 340, and the thickness of the second insulating layer 330 may decrease from the side surface of each of the two neighboring first electrodes 340 toward a central region between the two neighboring first electrodes 340. That is, the thickness of the second insulating layer 330 between the plurality of first electrodes 340 decreases from the side surface of each of the electrodes toward the central region therebetween so that the vertex of the concave portion may have a smooth "V" shape. Accordingly, the second insulating layer 330 between the plurality of first electrodes 340 has a variation in thickness, and a height T2 of a region in direct contact with the side surface of the plurality of first electrodes 340 is greatest and a height T3 of the central region may be less than the height T2 of the region in direct contact with the side surfaces of the plurality of first electrodes 340. That is, the height T3 of the central region of the second insulating layer 330 between the plurality of first electrodes 340 may be smallest in the second insulating layer 330 between the plurality of first electrodes 340. In addition, a height T1 of the second insulating layer 330 under the plurality of first electrodes 340 may be less than the height T3 of the central region of the second insulating layer 330 between the plurality of first electrodes 340. Accordingly, since the second insulating layer 330 may be disposed on the lower surface of the first electrode 340 as well as the side surface of the first electrode 340, the contact area between the first electrode 340 and the second insulating layer 330 may be increased, and the bonding force and the heat transfer performance between the first electrode 340 and the second insulating layer 330 may be increased. Here, the concave portion of the second insulating layer 330 may vertically overlap the uneven portion of the first insulating layer 320, and the concave portion of the second insulating layer 330 may be formed on a surface opposite to the surface bonded to the uneven portion of the first insulating layer 320 among both surfaces of the second insulating layer 330. Accordingly, an uneven portion corresponding to the uneven portion of the first insulating layer 320 may also be formed on the surface bonded to the uneven portion of the first insulating layer 320 among the both surfaces of the second insulating layer 330 so that the bonding force and the heat transfer performance between the first insulating layer 320 and the second insulating layer 330 may be increased.

Meanwhile, depending on the composition of the first insulating layer 320 and the second insulating layer 330, at least one of hardness, elastic modulus, elongation, and Young's modulus of the first insulating layer 320 and the second insulating layer 330 may be varied, and accordingly, it is possible to control withstand voltage performance, thermal conduction performance, bonding performance, thermal shock mitigation performance, and the like.

For example, the weight ratio of the composite to the entire first insulating layer 320 may be greater than the weight ratio of the inorganic filler to the entire second insulating layer 330. As described above, the composite may be a composite containing silicon and aluminum, and more specifically, a composite containing at least one of an oxide, a carbide, and a nitride containing silicon and aluminum. For example, the weight ratio of the composite to the entire first insulating layer 320 may be greater than 80 wt %, and the weight ratio of the inorganic filler to the entire second insulating layer 320 may be 60 to 80 wt %. As described above, when the content of the composite included in the first insulating layer 320 is greater than that of ceramic particles included in the second insulating layer 330, the hardness of the first insulating layer 320 may be greater than that of the second insulating layer 330. Thus, the first insulating layer 320 may simultaneously have high withstand voltage performance and high thermal conduction performance.

Accordingly, the second insulating layer 330 may have a greater elasticity than the first insulating layer 320. Thus, the second insulating layer 330 may increase the bonding performance between the first insulating layer 320 and the first electrode 340 and may mitigate a thermal shock while driving the thermoelectric element 300. Here, the elasticity may be expressed as tensile strength. For example, a tensile strength of the second insulating layer 330 may be in a range of 2 to 5 MPa, preferably 2.5 to 4.5 MPa, and more preferably 3 to 4 MPa, and a tensile strength of the first insulating layer 320 may be in a range of 10 MPa to 100 MPa, preferably 15 MPa to 90 MPa, and more preferably 20 MPa to 80 MPa.

Here, a thickness of the first insulating layer 320 may be in a range of 20 to 35 μm, and a thickness of the second insulating layer 330 may be in a range of 20 to 70 μm, preferably 30 to 60 μm, and more preferably 35 to 50 μm. In this case, the thickness of the second insulating layer 330 may be 1 to 3.5 times, preferably 1 to 3 times, and more preferably 1 to 2 times the thickness of the first insulating layer 320.

When the thickness of the first insulating layer 320 and the thickness of the second insulating layer 330 satisfy the above numerical ranges, it is possible to simultaneously obtain the withstand voltage performance, the thermal conduction performance, the bonding performance, and the thermal shock mitigation performance. In particular, when the thickness of the first insulating layer 320 is less than 20 μm, it is difficult to obtain high withstand voltage performance, and the first insulating layer 320 may be easily broken due to thermal expansion of the second insulating layer 330, and when the thickness of the first insulating layer 320 exceeds 35 μm, the thermal conduction performance may be lowered.

The insulating layer 370 disposed on the second substrate 380 may have the same structure as the insulating layers 320 and 330 disposed on the first substrate 310. That is, the insulating layer 370 disposed on the second substrate 380 may include a third insulating layer 372 formed of a resin layer including at least one of an epoxy resin composition and a silicone resin composition and a fourth insulating layer 374 formed of a composite containing silicon and aluminum.

In this case, the fourth insulating layer 374 may be in direct contact with the second substrate 380, and the third insulating layer 372 may be disposed between the fourth insulating layer 374 and the second electrodes 360. A detailed description of the third insulating layer 372 may be applied in the same manner as that of the second insulating layer 330, and a detailed description of the fourth insulating layer 374 may be applied in the same manner as that of the first insulating layer 320.

Alternatively, the third insulating layer 372 may be formed of a resin layer including at least one of an epoxy resin composition and a silicone resin composition, and the fourth insulating layer 374 may be formed of a resin layer including at least one of an epoxy resin composition and a silicone resin composition. In this case, the resin layer forming the third insulating layer 372 and the resin layer forming the fourth insulating layer 374 may have the same composition or different compositions. Here, the different compositions may mean that at least one of the type of a resin, the content of a resin, the type of an inorganic filler, and the content of an inorganic filler is different.

Meanwhile, power is generally connected to the electrode disposed at a cold side of the thermoelectric element 300, and thus higher withstand voltage performance may be required on the cold side compared to a hot side. In contrast, when the thermoelectric element 300 is driven, the hot side of the thermoelectric element 300 may be exposed to a high temperature, for example, at least about 180° C., and delamination between the electrode, the insulating layer, and the substrate occurring due to different thermal expansion coefficients between the electrode, the insulating layer, and the substrate may be a problem. Accordingly, higher thermal shock mitigation performance may be required on the hot side of the thermoelectric element 300 compared to the cold side thereof. Accordingly, the structure of the insulating layer at the hot side may be different from the structure of the insulating layer at the cold side.

Hereinafter, description will be made with the assumption that the first substrate 310 is disposed at the cold side of the thermoelectric element 300 and the second substrate 380 is disposed at the hot side of the thermoelectric element 300.

Referring to FIG. 6, a thickness of a fourth insulating layer 374 at a second substrate 380 side may be less than a thickness of a first insulating layer 320 at a first substrate 310 side, and a thickness of a third insulating layer 372 at the second substrate 380 side may be greater than a thickness of a second insulating layer 330 at the first substrate 310 side. Alternatively, referring to FIG. 7, an insulating layer at a first substrate 310 side may include a first insulating layer 320 and a second insulating layer 330, and an insulating layer 370 at a second substrate 380 side may be made of only a resin layer including at least one of an epoxy resin composition and a silicone resin composition.

Accordingly, the thermal shock mitigation performance at the hot side may be increased, and the possibility of the delamination, which may occur due to the different thermal expansion coefficients between the substrate and the electrode at the hot side, may be minimized.

The thermoelectric element according to the embodiment of the present disclosure may be applied to a power generation device, a cooling device, and a heating device. In more detail, the thermoelectric element according to the embodiment of the present disclosure may be mainly applied to optical communication modules, sensors, medical devices, measurement devices, the aerospace industry, refrigerators, chillers, vehicle ventilation seats, cup holders, washing machines, dryers, wine cellars, water purifiers, power supplies for sensors, thermopiles, and the like.

Here, an example in which the thermoelectric element according to the embodiment of the present disclosure is applied to a medical device includes a polymerase chain reaction (PCR) device. The PCR device is a device for amplifying deoxyribonucleic acid (DNA) to determine a DNA base sequence and requires accurate temperature control and a thermal cycle. To this end, a Peltier-based thermoelectric element may be applied.

Another example in which the thermoelectric element according to the embodiment of the present disclosure is applied to a medical device includes a photo detector. Here, the photo detector includes an infrared/ultraviolet detector, a charge coupled device (CCD) sensor, an X-ray detector, a thermoelectric thermal reference source (TTRS), and the like. A Peltier-based thermoelectric element may be applied to cool the photo detector. Accordingly, it is possible to prevent a variation in wavelength, a decrease in output, and a decrease in resolution due to an increase in temperature in the photo detector.

Still other examples in which the thermoelectric element according to the embodiment of the present disclosure is applied to a medical device include an immunoassay field, an in vitro diagnostics field, general temperature control and cooling systems, a physical therapy field, a liquid chiller system, a blood/plasma temperature control field, and the like. Accordingly, accurate temperature control is possible.

Yet another example in which the thermoelectric element according to the embodiment of the present disclosure is applied to a medical device includes an artificial heart. Accordingly, power may be supplied to the artificial heart.

Examples of the thermoelectric element according to the embodiment of the present disclosure applied to an aerospace industry include a star tracking system, a thermal imaging camera, an infrared/ultraviolet detector, a CCD sensor, the Hubble space telescope, a TTRS, and the like. Accordingly, it is possible to maintain a temperature of an image sensor.

Other examples in which the thermoelectric element according to the embodiment of the present disclosure is applied to an aerospace industry include a cooling device, a heater, a power generation device, and the like.

In addition to the above description, the thermoelectric element according to the embodiment of the present disclosure may be applied for power generation, cooling, and heating in other industrial fields.

Although the exemplary embodiments of the present disclosure have been described above, it may be understood by those skilled in the art that a variety of modifications and changes may be made without departing from the concept and scope of the present disclosure disclosed within the range of the following claims.

The invention claimed is:

1. A thermoelectric element comprising:
a substrate;
a first insulating layer disposed on the substrate;
a second insulating layer disposed on the first insulating layer;
an electrode disposed on the second insulating layer; and
a semiconductor structure disposed on the electrode,
wherein an upper surface of the second insulating layer includes a first recess on which the electrode is disposed, and a second recess disposed around the first recess,
wherein a distance between the second recess and the substrate is greater than a distance between a lower surface of the first recess and the substrate,
wherein the distance between the second recess and the substrate is less than a distance between an upper surface of the electrode and the substrate,
wherein the second recess does not vertically overlap with the upper surface of the electrode, and
wherein a thickness of the second insulating layer is greater than a thickness of the first insulating layer.

2. The thermoelectric element of claim 1, wherein a part of the electrode is buried in the first recess.

3. The thermoelectric element of claim 2, wherein a side surface of the electrode includes a first surface in contact with the first recess of the second insulating layer, and
wherein a height of the first surface is 0.1 to 0.9 times a thickness of the electrode.

4. The thermoelectric element of claim 2, wherein the highest height of the electrode is higher than the highest height of the second insulating layer with respect to the substrate.

5. The thermoelectric element of claim 1, wherein the thickness of the first insulating layer is less than 35 µm, the thickness of the second insulating layer is greater than 35 µm, and the thickness of the electrode is greater than 10 µm.

6. The thermoelectric element of claim 5, wherein an uneven pattern is disposed on an upper surface of the first insulating layer, and a lower surface of the second insulating layer includes an uneven pattern corresponding to the uneven pattern of the upper surface of the first insulating layer.

7. The thermoelectric element of claim 6, wherein a surface roughness of the uneven pattern disposed on the upper surface of the first insulating layer is 0.1 µm or more.

8. The thermoelectric element of claim 1, further comprising:
an upper electrode disposed on the semiconductor structure;
a third insulating layer disposed on the upper electrode; and
an upper substrate disposed on the third insulating layer.

9. The thermoelectric element of claim 8, wherein a thickness of the third insulating layer is greater than the thickness of the second insulating layer.

10. The thermoelectric element of claim 1, wherein the second recess vertically overlaps with the upper electrode.

11. The thermoelectric element of claim 10, wherein a lower surface of the third insulating layer includes a third recess concave toward the upper substrate, and
wherein the third recess vertically overlaps with a part of the first recess and the second recess.

* * * * *